United States Patent [19]

Vongfuangfoo et al.

[11] Patent Number: 5,278,447
[45] Date of Patent: Jan. 11, 1994

[54] SEMICONDUCTOR DEVICE ASSEMBLY CARRIER

[75] Inventors: Sutee Vongfuangfoo, Sunnyvale; Matthew Preston, San Jose, both of Calif.

[73] Assignee: LSI Logic Corporation, Milpitas, Calif.

[21] Appl. No.: 821,678

[22] Filed: Jan. 16, 1992

[51] Int. Cl.$^5$ ............................................. H01L 23/04
[52] U.S. Cl. ..................................... 257/727; 257/678
[58] Field of Search ...................... 357/79, 74, 80, 70; 361/386, 398, 417, 212, 421; 439/331

[56] References Cited

U.S. PATENT DOCUMENTS

| | | | |
|---|---|---|---|
| 3,940,786 | 2/1976 | Scheingold et al. | 357/74 |
| 4,007,479 | 2/1977 | Kowalski | 357/74 |
| 4,692,790 | 9/1987 | Oyamada | 357/74 |
| 5,038,248 | 8/1991 | Meyer | 357/70 |
| 5,065,279 | 11/1991 | Lazenby et al. | 357/79 |

Primary Examiner—Rolf Hille
Assistant Examiner—S. V. Clark
Attorney, Agent, or Firm—Gerald E. Linden; Michael D. Rostoker

[57] ABSTRACT

Damage to the package body and external leads of a leaded semiconductor device assembly is prevented by a carrier assembly. The carrier assembly includes a rigid bottom (lower) plate positively supporting the package body and providing a bottom cover for the external leads. A semi-rigid top (upper) plate positively holds the package body against the bottom plate, prevents movement of the package body with respect to the carrier assembly, and covers the external leads. Fasteners are provided for securing the upper plate to the lower plate, preferably at the four corners of the plates. In this manner, a durable "sandwich" structure is created, with the package disposed between the lower and upper plates and the body and leads well protected against damage.

3 Claims, 2 Drawing Sheets

SEMICONDUCTOR DEVICE ASSEMBLY CARRIER

TECHNICAL FIELD OF THE INVENTION

The invention relates to the handling of semiconductor device assemblies having external leads (i.e., versus pins), and more particularly to the handling of Ceramic Leaded Chip Carrier (CLCC) packages.

BACKGROUND OF THE INVENTION

As used herein, a "semiconductor device" is a silicon chip (die) containing circuit elements on a face thereof, and a "semiconductor device assembly" is a silicon chip contained within a package and connected (wired or bonded) to conductive leads which exit the package.

The patent literature is replete with examples of semiconductor device assemblies having a plurality of leads exiting the package. For example:

Commonly-owned U.S. Pat. Nos. 4,771,330 and 4,880,419 disclose an integrated circuit chip 10 mounted to a die attach pad 22. Lead fingers 16 radiate outward from the area of the die attach pad. Bond wires 18 connect the die to the inner ends of the lead fingers 16. The outer ends of the lead fingers 16 are bonded (26) to package leads 28 which extend outward from the enclosing package 32. These two patents are examples of epoxy encapsulated semiconductor device assemblies.

Ceramic packaged semiconductor device assemblies are also common, examples of which are found in U.S. Pat. No. 4,899,207 and U.S. Pat. No. 4,903,113.

The complexity of modern semiconductor devices results in a high number of leads. Lead counts in excess of one hundred are not uncommon. For high lead count packages, the leads are necessarily very thin and closely spaced. Spacing on the order of 15-25 mils (center-to-center) is not uncommon. Evidently, these leads are very delicate, and extreme care must be exercised in handling the package to avoid damaging the leads so that they can be properly aligned with conductors on a printed wiring board (e.g.) to which the packaged device is ultimately mounted. Common damage modes include: 1) physical distortion of the leads, or 2) removal of plating from the leads due to scraping (the leads are commonly gold-plated).

In the process of packaging a semiconductor device, it is typical that the semiconductor die is inserted into an opening in the package. The package already has external leads exiting the package body, and lead fingers within the package body. The lead fingers are bonded (or wired) to the external leads. After the semiconductor device is connected to the lead fingers, a lid is applied over the package opening to seal the device within the package. During these packaging steps, there are many opportunities for causing damage to the external leads while handling and processing the package.

FIG. 1 shows a typical semiconductor device assembly 100, for which the present invention is especially pertinent. The assembly includes a square, flat ceramic package 102 containing a semiconductor die (not shown) within a cavity that is covered by a lid 104. A plurality of external leads 106 emanate from each side of the package 102, generally coplanar with the bottom surface of the package. Only eight leads per side are shown, for illustrative clarity. During installation of the semiconductor device in the package, the outer ends of the leads 106 are typically connected together by a lead frame ring 108 which helps support the leads. The leads 106 and the ring 108 are formed of a single patterned piece of metal (e.g., gold-plated copper) which is on the order of only about 8 mils thick. The leads themselves are usually about 350 mils long and 8 mils wide, and lead spacing of 15-25 mils is common. Evidently, the leads are extremely delicate.

After the semiconductor device is mounted and connected within the sealed package, the lead frame is excised. Often, there are holes 110 disposed at the four corners of the lead frame for locating the entire assembly in a machine that excises the lead frame.

As mentioned above, in the process of mounting the die in the package, and capping the package, the entire assembly is typically passed through an oven. Typically the lid is provided with a peripheral solder seal that will fuse with a corresponding metallic ring around the periphery of the package opening when exposed to a thermal cycle in the oven. Conveyor transports are common, and the packages may be placed on "boats" for the journey through the oven.

These "boats" are rigid structures having openings for the package body. These openings provide access from the bottom of the boat for automated machinery to lift the semiconductor assembly up from the boat during some of the packaging processes. Typically, the package is laid down directly on the boat, with the leads supporting the entire semiconductor device assembly. Because the boat is the direct support for the semiconductor device assembly, contact between the leads and the boat occurs. During the installation and removal of the package from the boat, physical bending of the leads may occur because of the close tolerances necessary to maintain package alignment. At the points of contact, motion of the semiconductor device assembly on the boat has been observed to cause the lead coating (plating) to be worn or scratched away, exposing either the under coat or the base metal. Further, with existing boat transports, the ceramic package body is not directly supported, since the package is held in place by the lead structure. This has been observed to allow damage to the ceramic through chipping or cracking. Further, with existing boat transport techniques, the leads are exposed to the operating environment during the above-mentioned processes, and contamination of the leads has been observed to occur from various forms of splatter.

DISCLOSURE OF THE INVENTION

It is an object of the present invention to provide a technique for protecting the package leads of a semiconductor device assembly from damage during handling, such as during package fabrication steps.

It is another object of the invention to provide a technique for protecting the package body of a semiconductor device assembly from damage during handling, such as during package fabrication steps.

It is another object of the invention to provide a technique for preventing motion of a semiconductor device assembly relative to a boat.

It is another object of the invention to provide a technique for preventing contamination to the leads of a semiconductor device assembly during transport through a furnace (oven).

According to the invention, a carrier is provided for leaded semiconductor device assemblies (packages). The carrier includes an upper plate and a lower plate. The lower plate is a rigid structural member that supports the package body and the external leads. The upper plate is constructed of a springy metal, and holds the package body and external leads firmly against the lower plate, and covers the external leads. Fasteners are provided for securing the upper plate to the lower plate, preferably at the four corners of the plates. In this manner, a durable "sandwich" structure is created, with the package disposed between the lower and upper plates and the leads well supported to prevent damage during handling.

According to an aspect of the invention, the lower plate is shaped as a square ring. The inner periphery of the ring has a raised lip for supporting the periphery of the package body. The outer dimension of the lower plate is sufficient to provide support for the package leads.

According to another aspect of the invention, the upper plate is also shaped as a square ring, with an opening that fits over the package body. The outer dimension of the upper plate is sufficient to sandwich the package leads between the upper and lower plates.

According to another aspect of the invention, the upper plate is provided with tabs exerting pressure on the package. This holds the package under spring pressure, downward against the lip of the lower plate, minimizing package movement.

According to another aspect of the invention, the upper plate is provided with "stops", preventing lateral (in-plane) movement of the package body.

According to another aspect of the invention, the lower plate is provided with alignment posts, and the upper plate is provided with mating alignment holes.

According to another aspect of the invention, the lower and upper plates are provided with aligned holes, into which removable fastening members are inserted for holding the "sandwich" (lower plate/package/upper plate) securely together.

Hence, it is seen that the semiconductor device assembly carrier of the present invention provides a technique for providing a high degree of protection to both the package body and the leads.

Other objects, features and advantages of the invention will become apparent in light of the following description thereof.

DETAILED DESCRIPTION OF THE INVENTION

Figure 1:
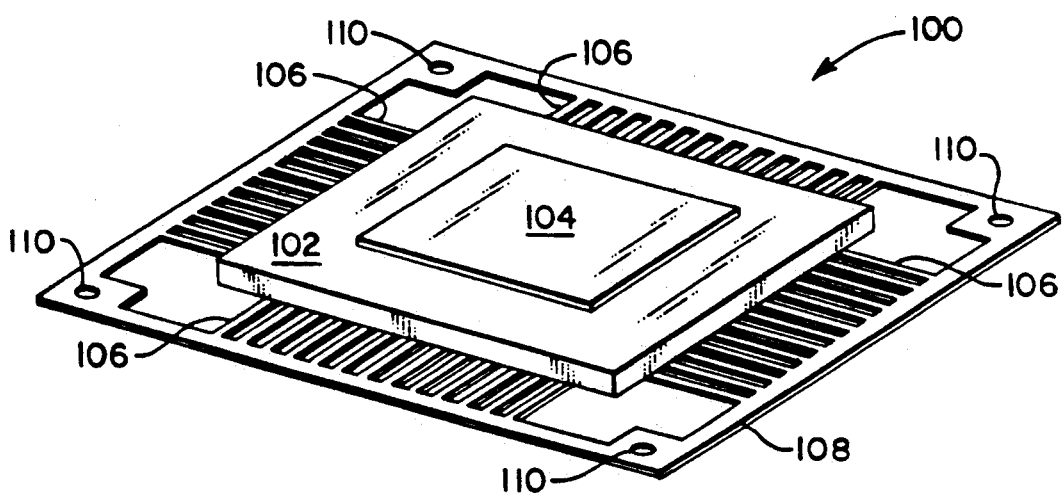
FIG. 1 is a perspective view of a ceramic semiconductor device assembly of the prior art.

FIG. 1 shows a typical Ceramic Leaded Chip Carrier (CLCC) package of the prior art, and has been discussed above.

As discussed above, the leads 106 and body 102 of the semiconductor device assembly 100 are subject to several damage modes during handling, especially when the semiconductor device assembly 100 is laid onto a boat for conveying through a furnace.

Figure 2:
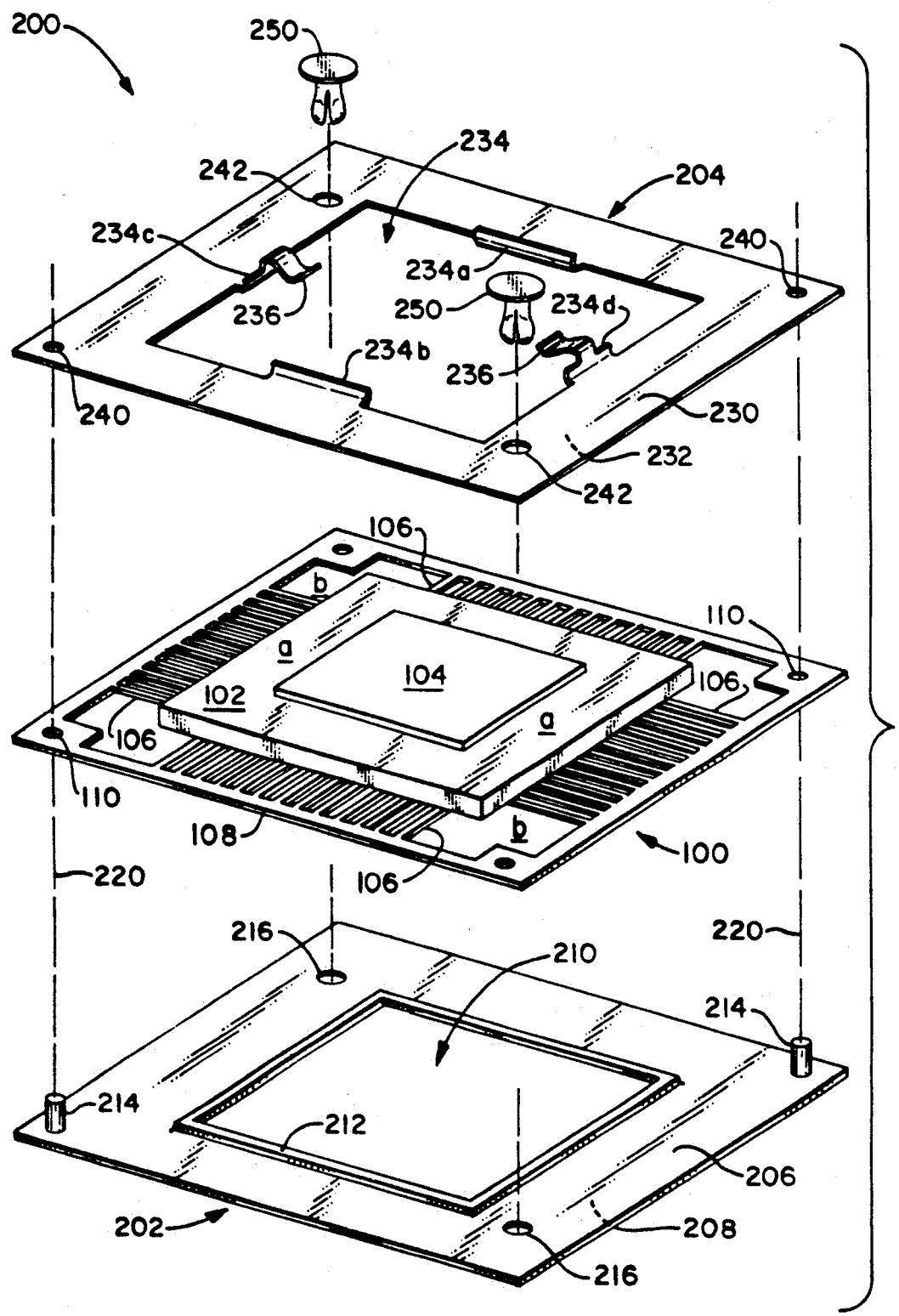
FIG. 2 is an exploded perspective view of the carrier of the present invention.

FIG. 2 shows the semiconductor device assembly carrier 200 of the present invention. The carrier includes a bottom plate 202, a top plate 204 and fasteners 206. As shown in this exploded view, a leaded semiconductor device assembly (e.g., 100 of FIG. 1) is sandwiched between the upper and lower plates of the carrier 200.

The bottom plate 202 is essentially a square, rigid ring, having a an upper surface 206, a lower surface 208 and a central opening 210 extending completely through the plate. A lip 212 is formed around the periphery of the opening 210, and extends upward about 0.020 inches from the upper surface 206 to support the outer periphery of the package body 102. The lower plate 202 is also provided with at least two guide pins 214, preferably at at least two opposite corners of the plate, extending upward from the top surface 206. The lower plate is also provided with at least two holes 216 (preferably four, as discussed hereinbelow), disposed at the remaining two opposite corners of the plate.

The bottom plate 202 is formed of a rigid material, such as 0.020 inch thick brass plate, stainless steel, or plated stainless. The opening 210, lip 212 and holes 216 are conveniently formed by a punching operation. The pins 214 are conveniently pressed into holes (not shown, also formed in the punching operation) from the back side 208 of the plate.

As indicated by the dashed lines 220, the pins 214 are aligned with two of the lead frame locating holes 110. These holes 110 are typically provided for locating the semiconductor device assembly 110 on a machine that excises the lead frame 108. (See discussion of FIG. 1, above.)

The top plate 204 is essentially a square, semi-rigid ring, having an upper surface 230, a lower surface 232 and a central opening 234 extending completely through the plate. At least one "stop" 234a, 234b, 234c and 234d is integrally formed on each of the four sides of the inner periphery of the opening 234. Two of these stops 234a and 234b are disposed on opposite sides of the opening, and extend into the opening and then curve upward out of the plane of the top surface 230. The other two stops 234c and 234d are disposed on alternate opposite sides of the opening, and also extend into the opening and curve upward. The stops 234c and 234d are also provided with tabs 236 extending further into the opening and curved to exert a spring force on the top surface of the package body 102.

At least two locator holes 240 are disposed at opposite corners of the top plate, and are positioned and dimensioned for receiving the locating pins 214 of the bottom plate, as indicated by the dashed lines 220.

At least two other holes 242 are disposed at alternate opposite corners of the top plate, and are aligned with the holes 216 on the bottom plate. At least two push fasteners 250 are provided which, in use, will releasably fasten the top plate to the bottom plate via the holes 242 and 216. Preferably, there are holes 216 in each of the four corners of the bottom plate 202, holes 242 in each of the four corners of the top plate 204, and four fasteners 206 for securing the top plate to the bottom plate at the four corners.

The upper plate 204 is formed of a springy material, such as 0.015 inch thick spring steel or stainless steel.

In use, the semiconductor device assembly 100 is placed onto the lower plate 202 with the periphery of the body 102 resting upon the lip 212. Also, the holes 110 are aligned over the pins 214. At this stage of assembling the carrier 200, the leads 106 will be "floating" above the upper surface 206 of the bottom plate, with a clearance of about 0.005 inch therebetween. This ensures that the lip 212 is indeed supporting the body 102.

Next, the top plate 204 is placed over the semiconductor device assembly 100, and the tabs 236 contact the top surface of the package body 102 at points "a". Also, the pins 214 will extend through the holes 240.

Next, the top plate 204 is pushed together with the bottom plate 202, and the fasteners 250 are inserted through the holes 242 in the upper plate 204, through open areas "b" in the lead frame 108, and through the holes 216 in the bottom plate 202. At this stage:

(1) the body 102 is held securely ("sandwiched") between the tabs 236 of the upper plate 204 and the lip 212 of the lower plate 202, thereby preventing movement of the package body;

(2) the leads 106 are lightly sandwiched between the lower surface 232 of the upper plate 204 and the upper surface 206 of the bottom plate 202, thereby preventing bending or scraping the leads (the leads may "float" between the plates); and (3) the leads 106 are completely covered by the top and bottom plates, thereby preventing contamination from sputtering.

Hence, it can be seen that the carrier 200 provides a safe technique for handling the semiconductor device assembly, for example during installation of the semiconductor device into the package and subsequent installation of the lid 104 onto the package.

With the carrier assembled and containing a semiconductor chip assembly 100, the four stops 234a -d are spaced about 0.010 inch from respective side edges of the body 102. This prevents any lateral movement of the package body.

Notably, the opening 210 allows automated machinery to lift the entire assembly 200 off of a boat, by lifting up on the base of the package body 102.

The description of FIG. 2 has been stylized to provide a readily understandable presentation of the salient features of the present invention. In a preferred embodiment, there are more holes 216, 242, etc. Appended hereto, and forming part of the disclosure hereof are drawings of the top and bottom plates, and fastener 250. These are actual assembly drawings, containing sufficient information to enable one of ordinary skill in the art to manufacture the carrier of this invention.

What is claimed is:

1. Semiconductor device assembly carrier, for supporting a semiconductor package having leads extending from four sides of a package body, an outer ring joining ends of the leads, and locating holes in the outer ring, and for protecting the leads, the carrier comprising:

(A) a bottom plate having:
  (a) a top surface for supporting leads extending from four sides of a semiconductor package body,
  (b) a bottom surface, having a central opening,
  (c) an upwardly-extending lip disposed around the central opening for supporting only the periphery of the package body, and
  (d) at least two upwardly-extending guide pins aligned with and extending through locating holes on the lead frame ring;

(B) a top plate having:
  (e) a top surface,
  (f) a bottom surface,
  (g) a central opening larger than the package body, so that the package body is received through the top plate when the top plate is assembled to the bottom plate with the semiconductor package received between the top plate and the bottom plate,
  (h) at least one stop formed integrally with the top plate on an inner periphery of the central opening, said at least one stop extending into the opening, and curved upward, said at least one stop laterally locating the package body within the opening,
  (i) a tab structure formed integrally on one or more of the stops, extending further into the opening, and exerting a spring force on a top surface of the package body when the top plate is assembled to the bottom plate with the semiconductor package received between the top plate and the bottom plate, and
  (k) first holes for receiving the guide pins; and (C) means for securing the top plate to the bottom plate.

2. Semiconductor device assembly carrier, according to claim 1, wherein the means for securing the top plate to the bottom plate comprises:
second holes in at least two corners of the top plate;
third holes in corresponding at least two corners of the bottom plate; and
fasteners extending through the second and third holes for releasably fastening the top plate to the bottom plate.

3. Semiconductor device assembly carrier, according to claim 1, wherein:
tabs are provided on at least two stops disposed on opposite sides of the central opening of the top plate.

* * * * *